United States Patent [19]

Alway et al.

[11] Patent Number: 4,809,541

[45] Date of Patent: Mar. 7, 1989

[54] ELECTRICAL TEST CONNECTOR AND METHOD FOR TESTING THE FORD VEHICLE SPEED CONTROL SYSTEM

[76] Inventors: Russell E. Alway; Joel A. Sylvia, both of P.O. Box 771, Lodi, Calif. 95241

[21] Appl. No.: 118,306

[22] Filed: Nov. 9, 1987

[51] Int. Cl.$^4$ ............................................. G01M 17/00
[52] U.S. Cl. .................................................... 73/118.1
[58] Field of Search ...................... 73/118.1, 117.3, 116

[56] References Cited

U.S. PATENT DOCUMENTS 4,402,217  9/1983  Higashiyama ..................... 73/117.3
4,567,756  2/1986  Colborn ............................. 73/118.1

Primary Examiner—Jerry W. Myracle
Attorney, Agent, or Firm—Basil B. Travis

[57] ABSTRACT

An electrical test connector and method have been invented for diagnostically testing the FORD vehicle Speed Control System on 1973 and later models, said connector designed to fit into the FORD wiring harness, and said connector further comprising a plurality of circuits, indicator lights and switches corresponding to the method by which it is used.

2 Claims, 3 Drawing Sheets

ELECTRICAL TEST CONNECTOR AND METHOD FOR TESTING THE FORD VEHICLE SPEED CONTROL SYSTEM

BACKGROUND OF THE INVENTION

This invention relates to an electrical test connector designed to be connected to the wiring harness of a motor vehicle's speed control system in order to perform a diagnostic check of a plurality of electronic sensors and functions.

More particularly, this invention relates to a method by which an electrical test connector may be used for diagnostic checking of the 1973 and later FORD Speed Control System components with or without the FORD Resume function.

As it is perhaps well known, many motor vehicles on the road today are factory equipped with a speed control system commonly known as "cruise control", which allows the driver to automatically regulate the speed of the vehicle by the use of a control head on or near the steering column. These speed control systems work on a variety of electromechanical and electronic mechanisms which are peculiar to the make and model of the vehicle, but in all cases the said systems require maintenance and diagnostic checking to insure that the system is working properly.

FORD's first speed control system appeared in 1960 and was replaced in 1973 and revised in 1979 to their current Speed Control System with Resume feature as an option in all their car lines, except Taurus and Sable, and it is the same system in many thousands of FORD vehicles on the road today. The 1979 FORD Speed Control System with Resume feature (hereinafter referred to and the "FORD System") is operated by controls on the vehicle steering wheel which in turn is connected to various system components and sensors through the speed control amplifier. In normal operation this speed control amplifier serves as an interfacing circuit between the driver's controls and the vehicle sensors and, as such, it determines the throttle setting by voltage inputs from the control switches, vehicle speed and throttle plate position. The speed control amplifier contains two wiring harnesses: input and output, each comprising six circuits. The input circuits have been designated by FORD by wire color as follows: Ignition Feed Circuit (purple); Amplifier Control Line Circuit (light blue-black hash); Brake Feed Switch (light green); Vehicle Sensor Ground to Sensor Signal (black); Sensor Signal (dark green-white stripe); Servo Vacuum Solenoid (gray-black hash). Accordingly, the output circuits have been designated by FORD by wire color as follows: Servo Power/Servo Vent/Servo Vacuum Solenoid (gray-black hash); Servo Vent Solenoid (white-pink hash); Servo Feedback/Negative/Servo Feedback Position (purple-light green hash); Servo Feedback Position (yellow-red hash); Servo Feedback/Positive (brown-light green hash); Amplifier Ground (black).

Now that the aforesaid circuits have been identified in the FORD System, a background discussion of the current diagnostic procedures shall be briefly explained. Heretofore, only two methods could be used to test the said FORD System. The first method is by use of the Rotunda Speed Control Tester No. 007-00013, manufactured by Bendix. This is a sophisticated and computerized multi-system diagnostic tester which is relatively expensive and difficult to operate for the average automobile repairman. Needless to say, it is found in only the most complete automobile repair shops and, therefore, it is rarely used. The second method is the manual method which consists of disconnecting the wiring harnesses at the amplifier and then checking each circuit connector with a voltmeter/ohmmeter. This is the method commonly in use, however to use this method it is necessary to first locate the correctly colored wire entering the harness and then insert the probes of the voltmeter/ohmmeter on the corresponding connectors. Accordingly, it can be easily seen that this task is somewhat like looking for a needle in a haystack, especially in a vehicle where the wires have become dirty or discolored with time as is usually the case. For example, it should not be too difficult to imagine looking for the difference between a purple wire and a purple wire with light green hash with a flashlight under a dashboard. Even if the colors could be distinguished, there is the additional problem of trying to read the voltmeter/ohmmeter.

It has long been felt that an alternative means was necessary for the average automobile repairman to perform diagnostic testing of the FORD System with accuracy, simplicity, and ease of operation. The above objective among others is achieved by using a specially designed electrical test connector, in conjunction with the herein described method, for diagnostic checking of the FORD System.

SUMMARY OF THE INVENTION

A method to be used in conjunction with an electrical test connector have been invented to diagnostically check the 1973 FORD Speed Control System, with or without Resume function, said connector designed to fit into the wiring harness of the FORD System and said connector further comprising a plurality of circuits for measuring the voltage and resistance of the individual circuits corresponding to the said speed control system components. The electrical test connector of this new invention consists of a small rectangular box means as the exterior case with indicator lights and switches thereon, one end of which is formed with two slots to receive both wiring harness connectors from the Ford System speed control amplifier connections, said slots containing pins and coupling elements in proper sequence conforming to the input and output circuits of the amplifier. Thus, our new invention takes the place of the speed control amplifier during the diagnostic test.

To perform a diagnostic test, the following steps are used:

1. Disconnect the wiring harnesses from the FORD System speed control amplifier located on or near the steering column under the dashboard;
2. Connect said wiring harnesses into the corresponding end of our new invention;
3. Connect the harness from our new invention to a standard voltmeter/ohmmeter;
4. Turn vehicle ignition ON. If the green light on our new invention labeled "IGN." is ON, then the vehicle's ignition feed circuit is working properly;
5. Look at the red light on our new invention labeled "BRAKE". If the vehicle brake feed switch is working properly, the red light will be ON when the vehicle's brakes are applied. If the vehicle has a clutch, depress the clutch while still holding the brake. If the red light goes out, the clutch switch is working properly;
6. Turn the selector switch located on our new invention to the position labeled "Controls" and read the voltmeter. If the vehicle's amplifier control line is functioning properly, the voltmeter will read 0 volts with all vehicle switches OFF. Then push the ON switch on vehicle steering wheel and read the voltmeter. 12 volts confirms proper working of the vehicle amplifier control line. Now switch the voltmeter/ohmmeter to read OHMS. If the vehicle's control circuit is working properly, the Ohmmeter will read:

0–1 Ohms when the vehicle's speed control OFF button is pushed,

110–130 Ohms when the vehicle's speed control COAST button is pushed,

640–720 Ohms when the vehicle's speed control SET-ACCEL button is pushed,

2000–2400 Ohms when the vehicle's speed control RESUME button is pushed;

7. Turn the selector switch located on our new invention to the position labeled "Speed Sensor" and read the Ohmmeter. The Ohmmeter will read between 30–100 Ohms if the vehicle's speed sensor signal is working properly.

8. Turn the selector switch located on our new invention to the position labeled "Vacuum Solenoid" and read the Ohmmeter. The Ohmmeter will read between 40–125 Ohms if the servo vacuum solenoid is working properly.

9. Turn the selector switch located on our new invention to the position labeled "Vent Solenoid" and read the Ohmmeter. If the vehicle's servo vent solenoid is working properly, the Ohmmeter will read between 60–190 Ohms.

10. Turn the selector switch located on our new invention to the position labeled "Servo" and read the Ohmmeter. If the servo feedback (negative) to servo feedback (positive) circuit is complete, the Ohmmeter will read 50,000 Ohms.

11. Turn the selector switch located on our new invention to the position labeled "Servo Position" and read the Ohmmeter. If the servo feedback position to servo feedback (negative) is working properly, the Ohmmeter will read 20,000–45,000 Ohms.

12. Switch the voltmeter/Ohmmeter to read volts and turn the selector switch located on our new invention to the position labeled "Vent Solenoid". Press the switch on our invention labeled "Vent Solenoid", and if this system is working properly the voltmeter will read 12 volts.

13. Turn the selector switch located on our new invention to the position labeled "Vacuum Solenoid" and press the switch on our invention labeled "Vacuum Solenoid". If this system is working properly, the voltmeter will read 12 volts.

14. CAUTION: THIS STEP REQUIRES STARTING THE VEHICLE'S ENGINE. SET PARKING BRAKE. IF THE VEHICLE HAS AN AUTOMATIC TRANSMISSION, SET IT IN PARK. BLOCK WHEELS. IMPORTANT: ENGINE SPEED WILL INCREASE DURING THIS TEST. With the engine running, switch the voltmeter/ohmmeter to read Ohms and turn the selector switch located on our new invention to the position labeled "Servo Position". Depress the switch on our invention labeled "Vent Solenoid" and hold it down during this test. Momentarily depress the switch on our invention labeled "Vacuum Solenoid" and observe the Ohmmeter. After each momentary depression of the "Vacuum Solenoid" switch, the Ohms reading will increase as the engine speed increases if this system is working properly. Release both "Vent Solenoid" and "Vacuum Solenoid" switches and observe the Ohmmeter. As the engine speed decreases, the Ohms reading should return to its original reading if the system is functioning properly.

15. After performing the above voltage and resistance measurements, correct any problems found and recheck the system.

16. Disconnect our invention from the wiring harness, and reconnect the vehicle amplifier.

DESCRIPTION OF THE PREFERRED EMBODIMENTS

Figure 1:
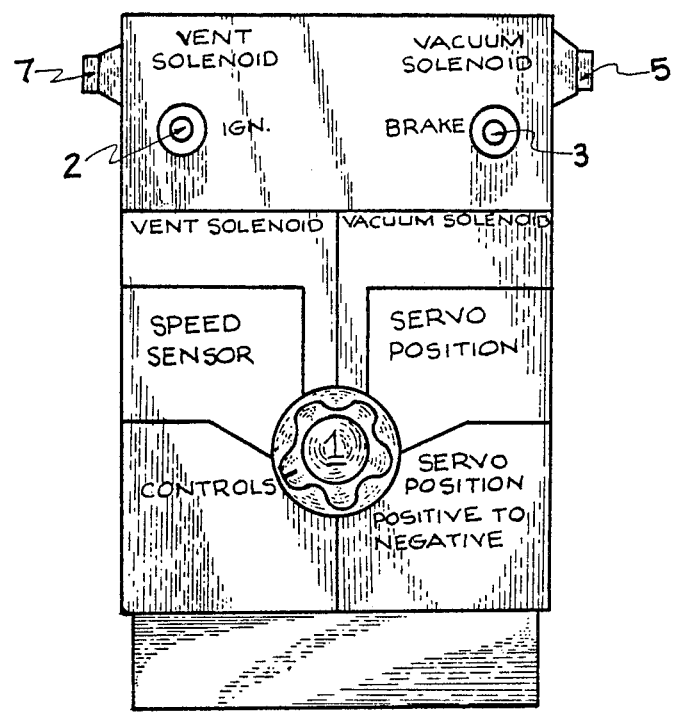
FIG. 1 is a top elevational view of the exterior casing module for the instant invention.
Figure 2:
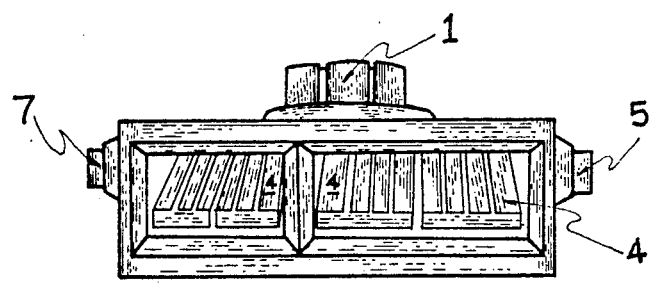
FIG. 2 is a front end elevational view of the casing module.
Figure 3:
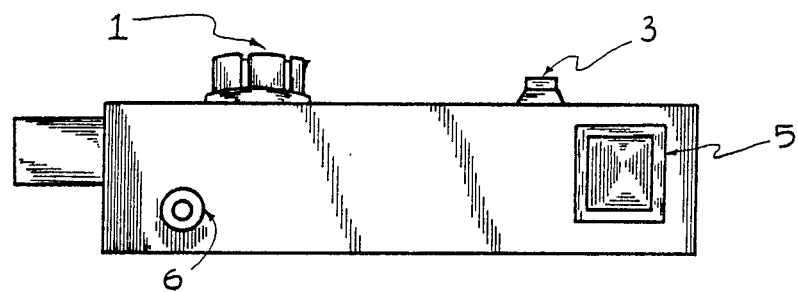
FIG. 3 is a right side elevational view of the casing module.
Figure 4:
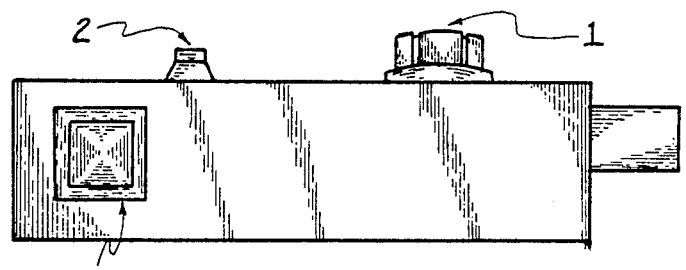
FIG. 4 is a left side elevational view of the casing module.

Turning now to the drawings, FIG. 1 shows the selector switch 1 on the exterior casing of the instant invention which is hand operated to the indicated position in order to check the desired circuit, function or sensor. A green indicator light 2 and a red indicator light 3 are also located on the top of the casing module. FIG. 2 shows the arrangement of pins 4 for receiving the vehicle wiring harness connectors which are both inserted into the front of the casing module during the test. FIG. 3 shows the push button switch 5 and jack for an voltmeter/ohmmeter 6. FIG. 4 shows a push button switch 7.

Figure 5:
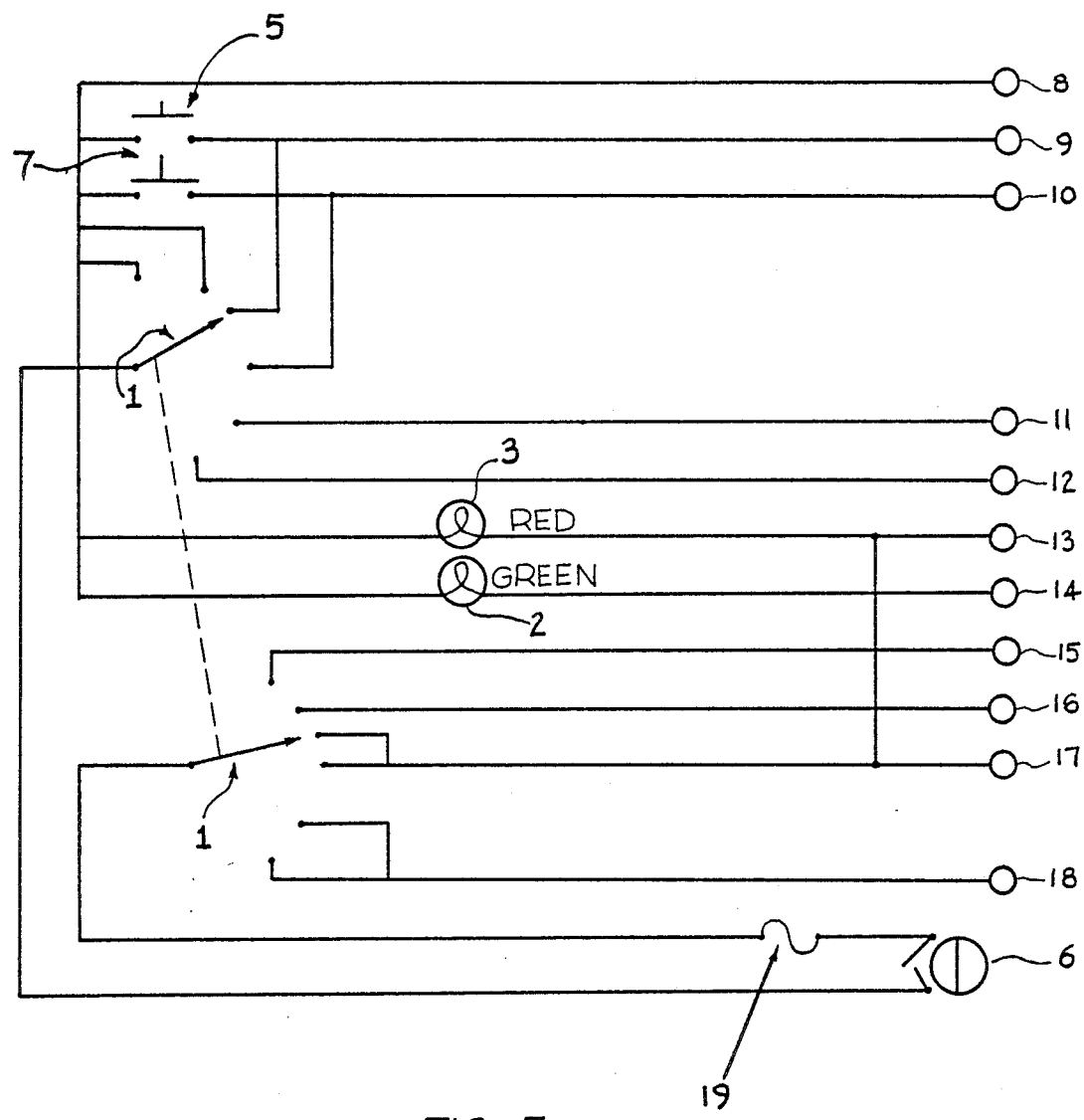
FIG. 5 is a circuit schematic of the embodiment of the instant invention.

Referring to FIG. 5, the circuit schematic, the vehicle's GROUND is connected at pin 8 and the vehicle's IGNITION is connected at pin 14. When the ignition is ON, the GREEN LIGHT 2 will be ON. The vehicle's BRAKE FEED SWITCH circuit is connected at pin 13, so that when the brakes are applied the RED LIGHT 3 will be ON. If the vehicle has a clutch, the vehicle's clutch switch will break the circuit and the RED LIGHT 3 will go out. The vehicle CONTROLS circuit is connected at pin 15, so that when the double pole selector switch 1 is turned to that position, a circuit is closed to the voltmeter/ohmmeter 6, on which the voltage and resistance measurements can be made for a variety vehicle control functions. The vehicle's SPEED SENSOR circuit is connected at pin 16 so that when the selector switch 1 is turned to that position a circuit is closed to the voltmeter/ohmmeter 6. Similarly, the vehicle's VACUUM SOLENOID circuit is connected at pin 9, the SERVO circuit at pins 12 and 18, the SERVO POSITION circuit at pin 11, the VENT SOLENOID circuit at pins 10 and 17, all of said connections allowing for checking by the voltmeter/ohmmeter by proper setting of the selector switch 1. With the selector switch 1 in the "Servo Position", a circuit is closed between pins 11 and 17. When "Vent Solenoid" button switch 7 and the "Vacuum Solenoid" button switch 5 are pushed at the same time, one circuit is closed to the voltmeter/ohmmeter 6 and the other circuit is closed to the vehicle's solenoids causing the engine speed to increase whereby resistance measurements may be made which are related to the speed of the engine. A fuse 19 is placed in line to the voltmeter-/ohmmeter as a safety feature.

We claim:

1. An electrical test connector for diagnostically checking the FORD Speed Control System on 1973 and later FORD vehicles, said connector comprising:
   A. A plurality of connector pins in proper sequence to interface with a speed control wiring harness for connecting to and testing the speed control sensors, actuators and systems commonly known as ground circuit, ignition circuit, brake feed switch, speed sensor, vacuum solenoid, servo controls, servo position circuit, vent solenoid, servo feedback circuit;
   B. A double-pole switching means to isolate and individually test the above said speed control components;
   C. An indicator means for visually evaluating the performance of the above said speed control components, said indicator means consisting of display lights and a connection means for using a common voltmeter/ohmmeter.

2. A method by which the electrical test connector of claim 1 is used to test the FORD Speed Control System of 1973 and later FORD Vehicles, said method comprising the following steps:
   A. connection of said electrical test connector to said vehicle's wiring harness;
   B. connection of a standard voltmeter/ohmmeter to said electrical test connector;
   C. operation of switches on said electrical test connector according to their indicated functions;
   D. comparison of readings from said voltmeter/ohmmeter with specifications of the FORD Speed Control System.

* * * * *